(12) United States Patent  
Harned et al.

(10) Patent No.: US 7,420,722 B2  
(45) Date of Patent: Sep. 2, 2008

(54) MULTIPLE ILLUMINATION SOURCE EXPOSURE APPARATUS

(75) Inventors: Robert D. Harned, Redding, CT (US); Noreen Harned, Redding, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 11/638,410

(22) Filed: Dec. 14, 2006

(65) Prior Publication Data

US 2007/0091491 A1 Apr. 26, 2007

Related U.S. Application Data

(62) Division of application No. 11/108,672, filed on Apr. 19, 2005.

(51) Int. Cl.
*G02B 26/08* (2006.01)
(52) U.S. Cl. .......................... 359/212; 359/900; 355/67
(58) Field of Classification Search ................ 359/212, 359/204, 900; 355/67
See application file for complete search history.

(56) References Cited

U.S. PATENT DOCUMENTS 5,957,587 A * 9/1999 Hong ........................ 384/108

| 6,128,131 | A | 10/2000 | Tang |
| 6,249,367 | B1 | 6/2001 | Hirose |
| 6,975,387 | B2 | 12/2005 | Mizuno |
| 2002/0126479 | A1* | 9/2002 | Zhai et al. ................... 362/244 |
| 2003/0137654 | A1 | 7/2003 | Mizuno |

* cited by examiner

*Primary Examiner*—Euncha P Cherry
(74) *Attorney, Agent, or Firm*—Sterne, Kessler, Goldstein & Fox P.L.L.C.

(57) ABSTRACT

A method of combining output of a plurality of light sources includes arranging a plurality of light sources in the same plane and having their beams directed at a first mirror, rotating the first mirror in the plane so as to direct the beams towards the same direction, and pulsing the light sources in synchronization with the rotation of the first mirror. The light sources can include, for example, pulsed lasers or lamps. The method can further include directing the beams from the first mirror towards a second counter-rotating mirror, wherein rotation of the second counter-rotating mirror compensates for angular displacement of the beams due to rotation of the first mirror. The method can also include orienting the first mirror at about 45 degrees relative to an incident path of the beams. This method can be used, for example, to expose a substrate in a lithography system.

9 Claims, 5 Drawing Sheets

MULTIPLE ILLUMINATION SOURCE EXPOSURE APPARATUS

CROSS-REFERENCE TO RELATED APPLICATIONS

This application is a divisional of U.S. patent application Ser. No. 11/108,672, filed Apr. 19, 2005 (now pending), which is incorporated herein by reference in its entirety.

BACKGROUND OF THE INVENTION

1. Field of the Invention

The present invention is related to multiple sources that can be used in, for example, lithographic systems.

2. Related Art

The manufacture of a liquid crystal display, or a flat panel display (FPD) involves a manufacturing process that is similar to that used in the integrated circuit (IC) industry that produces computer chips. An exposure system is used to project an image of a circuit pattern so as to expose a photo resist coated substrate. The actual circuit is created after the exposed substrate is processed using standard microlithographic processes. Depending on the particular FPD design, this exposure process may be repeated many times on one substrate for different layers to implement the circuit design. When all the exposures and microlithographic processing steps have been completed so the desired circuit pattern has been created, the substrate is integrated with other components to create a flat panel display screen.

Although FPDs have been in production since the late 1980s, the current size requirement is for FPDs of up to 42 inches diagonal, with 54 and 60 inches diagonal under development. (Note that in the United States, screen dimensions are usually specified using the English system, while optical design and tool dimensioning is usually done in metric.)

Having sources that output sufficient power for exposure is generally an issue of concern in lithographic systems, and is particularly of concern in lithographic systems that are used for FPD exposure. With modern FPDs having dimensions up to sixty inches diagonal (and even larger in the future), and with exposure areas increasing due to a desire to maximize overall FPD manufacturing throughput, electromagnetic radiation sources that output a very large amount of power are required. For example, FPD exposure systems under current consideration may require as much as 250 watts of power output, to expose relatively large FPDs. Lasers are typically used as sources for this purpose. However, lasers that produce outputs in the hundreds of watts are either unavailable, or extremely expensive. For example, lasers that are relatively easily available commercially typically range in the 10 to 25 watts of output. Furthermore, the cost of a laser system does not scale linearly with an increase in its power output, but tends to increase exponentially.

Accordingly, there is a need in the art for exposure systems that are relatively inexpensive and provide a large power output.

SUMMARY OF THE INVENTION

The present invention is directed to a multiple illumination source apparatus for lithographic exposure systems that substantially obviates one or more of the problems and disadvantages of the related art.

Accordingly, there is provided a system for combining outputs of multiple light sources including a plurality of light sources, and a rotatable fold mirror oriented at an angle so as to reflect beams from each of the light sources towards the same direction at various times during its rotation. A projection optical system directs the beams towards a substrate. The light sources can be pulsed lasers or lamps. The rotatable fold mirror can be mounted on an air bearing, a magnetic bearing or a fluid bearing (depending on the laser power, repetition rate and rotation accuracy desired), and can be oriented at about 45 degrees relative to the vertical. An optional fold mirror (or a prism diffractive element) for folding an optical axis of the system is between the rotatable fold mirror and the projection optical system. The fold mirror can counter-rotate in synchronization with the rotatable fold mirror so as to keep the direction of the beams constant. The rotatable fold mirror can be mounted on an air bearing, which in turn is mounted on an air bearing support. The air bearing and the air bearing support have a pass hole for passing the beams. Alternatively, the rotatable fold mirror can be mounted underneath the air bearing.

In another embodiment, a method of combining output of a plurality of light sources includes arranging a plurality of light sources in the same plane and having their beams directed at a first mirror; rotating a first mirror in the plane so as to direct the beams towards the same direction; and pulsing the light sources in synchronization with the rotation of the first mirror. The beams can be directed from the first mirror towards a second counter-rotating mirror, wherein rotation of the second counter-rotating mirror compensates for angular displacement of the beams due to rotation of the first mirror.

Additional features and advantages of the invention will be set forth in the description that follows. The advantages of the invention will be realized and attained by the structure particularly pointed out in the written description.

It is to be understood that both the foregoing general description and the following detailed description are exemplary and explanatory and are intended to provide further explanation of the invention.

DETAILED DESCRIPTION OF THE INVENTION

Figure 1:
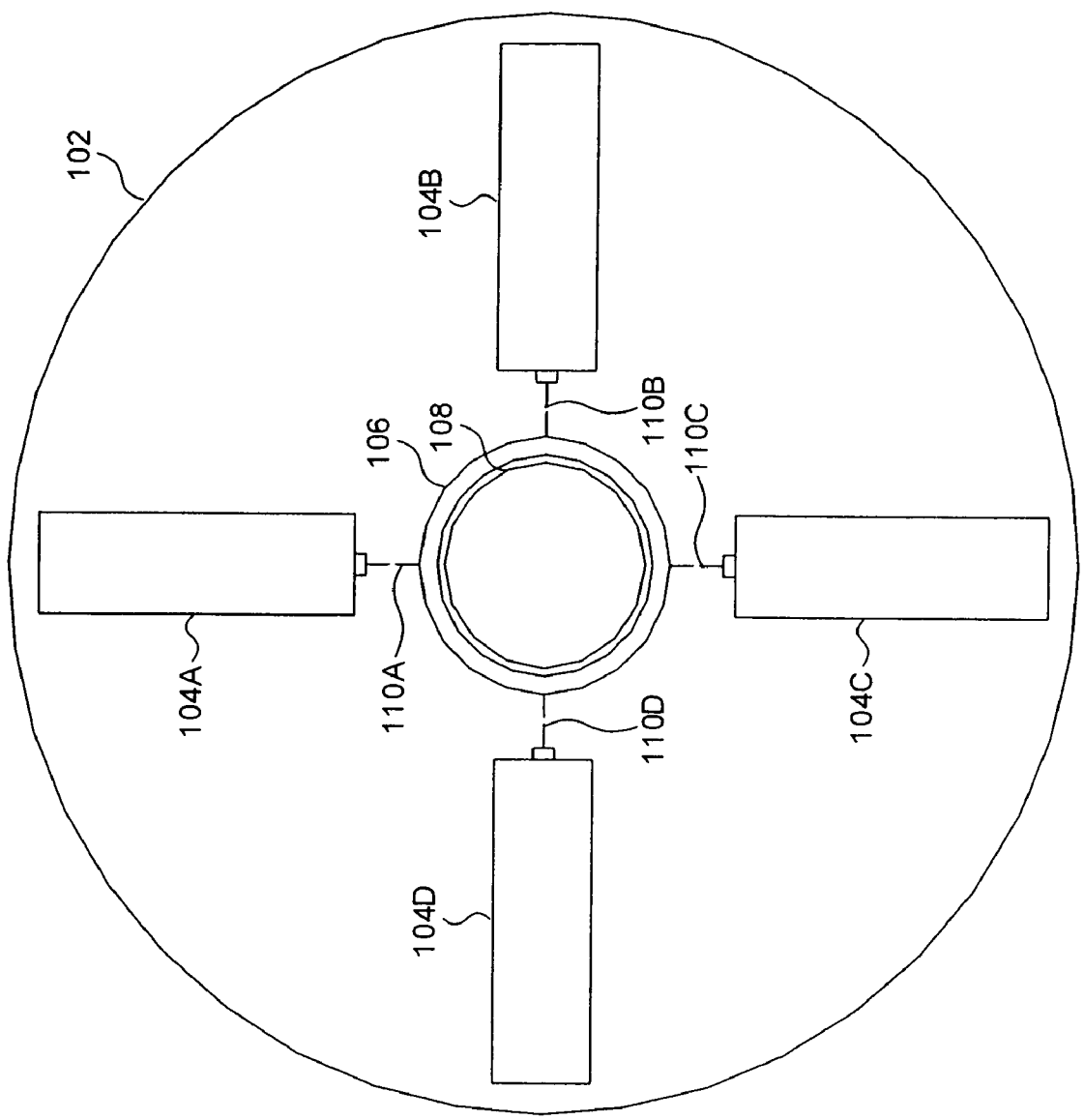
FIGS. 1 and 2 illustrate a top view and a side view, respectively, of one embodiment of the invention.

Reference will now be made in detail to the embodiments of the present invention, examples of which are illustrated in the accompanying drawings. Wherever possible, the same reference numeral is used to designate the same element in different figures.

The present invention utilizes multiple electromagnetic radiation sources to achieve a high power output directed at a substrate that is being exposed. Accordingly, there is no need for a single, very expensive high-power electromagnetic radiation source, since multiple commercially available sources may be used.

Figure 2:
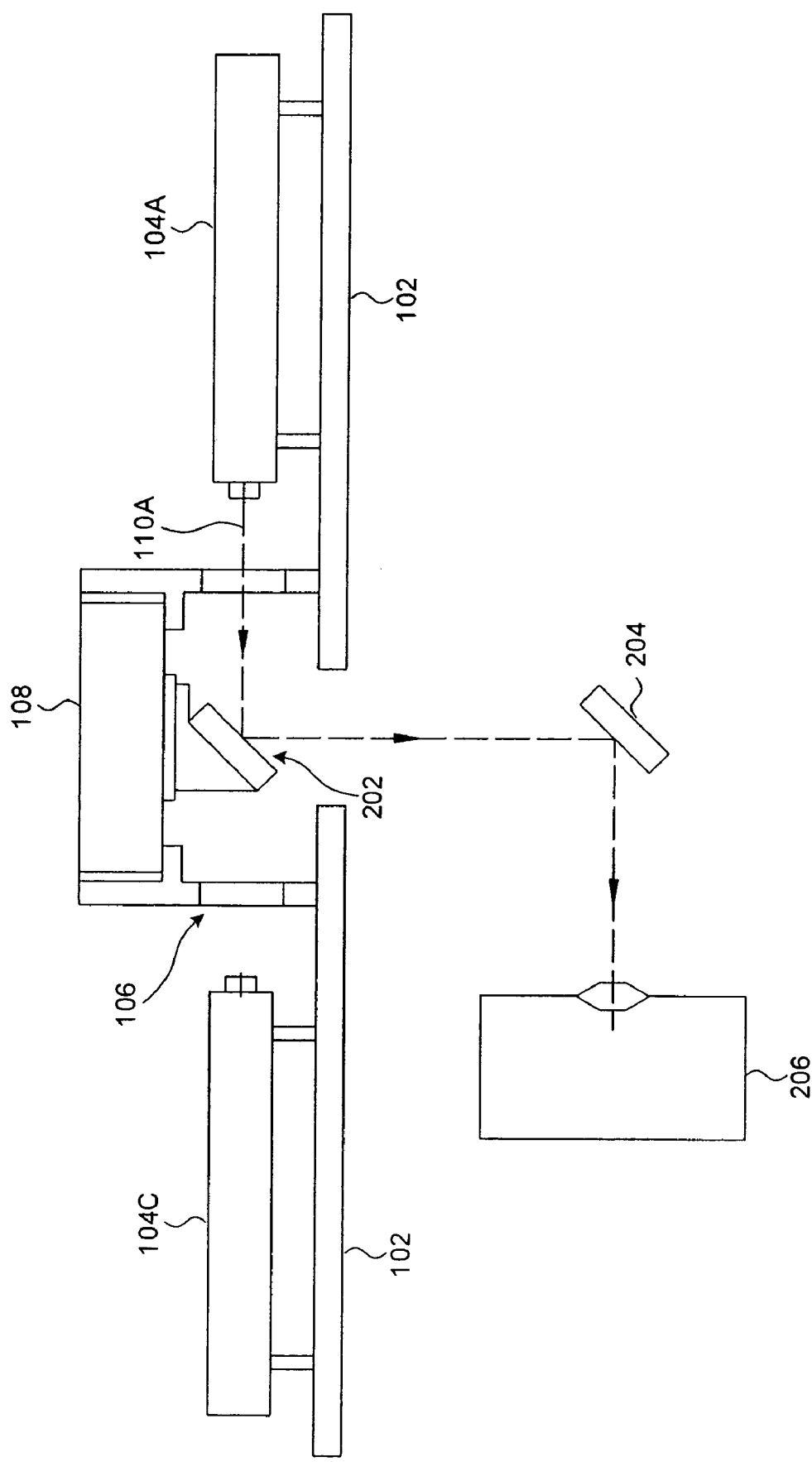

FIGS. 1 and 2 illustrate one embodiment of the invention. FIG. 1 shows a top view, and FIG. 2 shows a side view of a system for combining outputs of multiple sources for exposure of the same area on a substrate. As shown in FIGS. 1 and 2, an illumination source 101 includes sources 104A, 104B, 104C and 104D mounted on a support platform 102. A fold mirror 202 is mounted on a rotary air bearing 108 (or a magnetic bearing or a fluid bearing), which is in turn mounted on an (air) bearing support structure 106. The air bearing 108 can be a conventional air bearing, as is known in the art. The mirror 202 is oriented at a 45° angle and rotates, such that its orientation is synchronized with the output beams of the sources 104A-104C. The output beams are designated as 110A-110D in FIG. 1.

Note that although only four sources 104A-104D are shown in FIGS. 1 and 2, the invention is not limited to any particular number of sources. For example, a relatively large number (e.g., dozens or even hundreds) of such sources may be used. Furthermore, it will be appreciated that although in the illustrated embodiment, the sources 104 are lasers, and preferably semiconductor laser diodes, other types of sources may be used. For example, the sources 104 may be lamps, light emitting diodes, or they may be other types of lasers, such as Nd:YAG lasers, gas lasers, etc. Typical pulse width that is obtainable from such semiconductor lasers is approximately 100 nanoseconds (somewhat depending on how pulse width is defined).

Also shown in FIG. 2 is an optional second fold mirror 204, which directs the output of the sources 104 to projection optics 206. The projection optics 206 in turn directs the electromagnetic radiation towards a substrate being exposed (not shown in the figures). Other optical elements, such as beam conditioners, illumination optics, etc. (not shown in the figures), may also be used to shape and condition the beam, as would be understood by one of ordinary skill in the art.

It will also be appreciated that as the mirror 202 rotates, the position of the beam (for example beam 110A in FIG. 2) on the folding mirror 204 moves. The magnitude of this effect depends on the pulse duration and the rate of rotation of the mirror 202. For a relatively slow rotating mirror 202, and a relatively compact pulse, the change in the position of the beam 110A on the mirror 204 is relatively small. However, the faster the mirror 202 rotates, and the longer the pulse width, the more pronounced the effect may be. This effect may be acceptable for practical applications. In the event that it is not, it is also possible to mount the mirror 204 on an air bearing, similar to the mirror 202, and have it counter-rotate relative to the mirror 202. Thus, with the rotations of the mirrors 202 and 204 synchronized (and in opposite directions), the direction of the beam 110A going into the projection optics 206 will stay constant.

Also, for a pulse profile that is substantially symmetrical in time, it is preferable that the mirror be oriented "facing the source" that illuminates it (and 45° downward) at the pulse peak. For pulse profiles that are asymmetrical, it is preferred to have the energy of pulse be distributed symmetrically in time relative to the "facing the source" orientation of the mirror.

Figure 3:
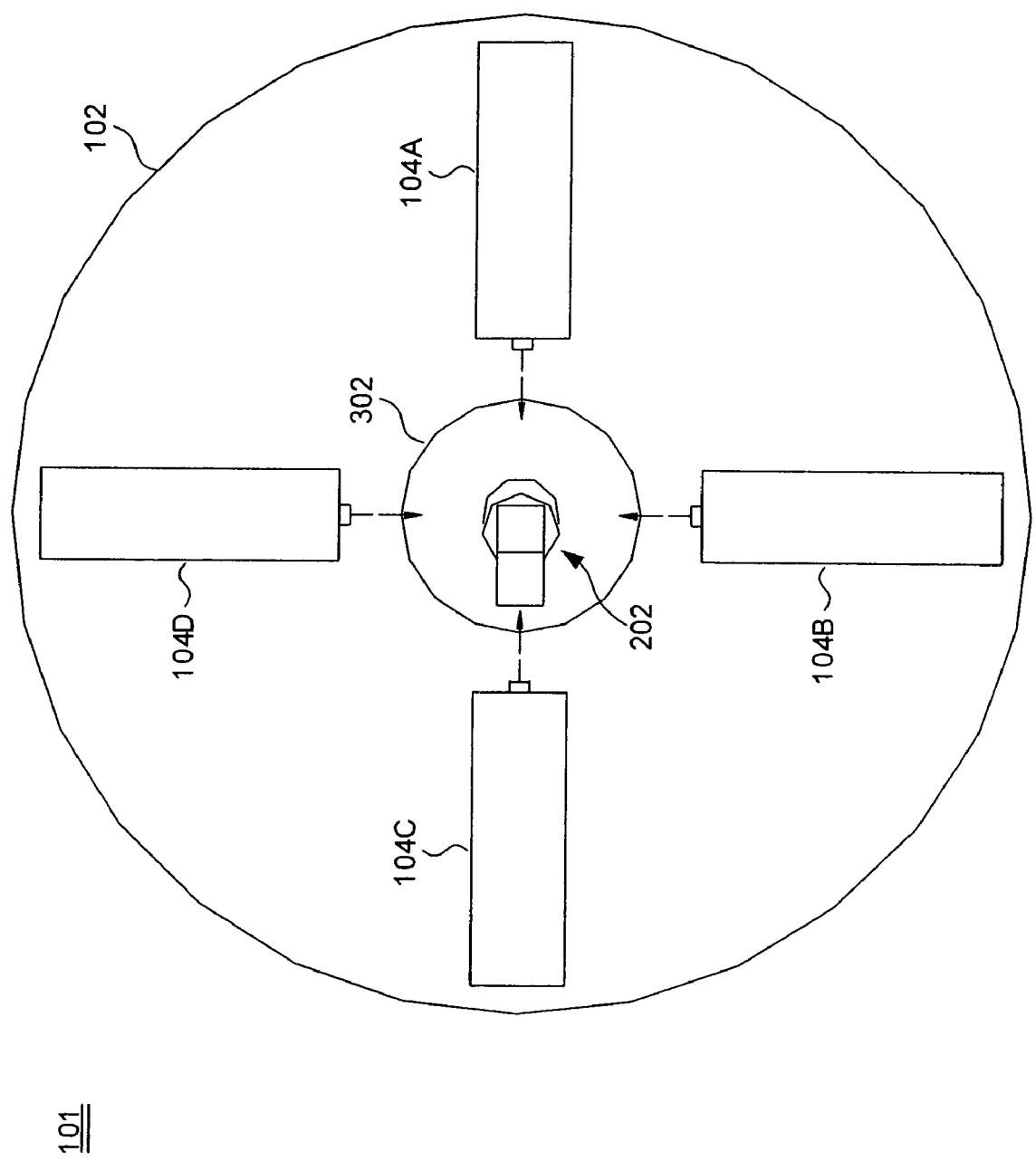
FIGS. 3 and 4 illustrate a top view and a side view, respectively, of an alternative embodiment of the invention.
Figure 4:
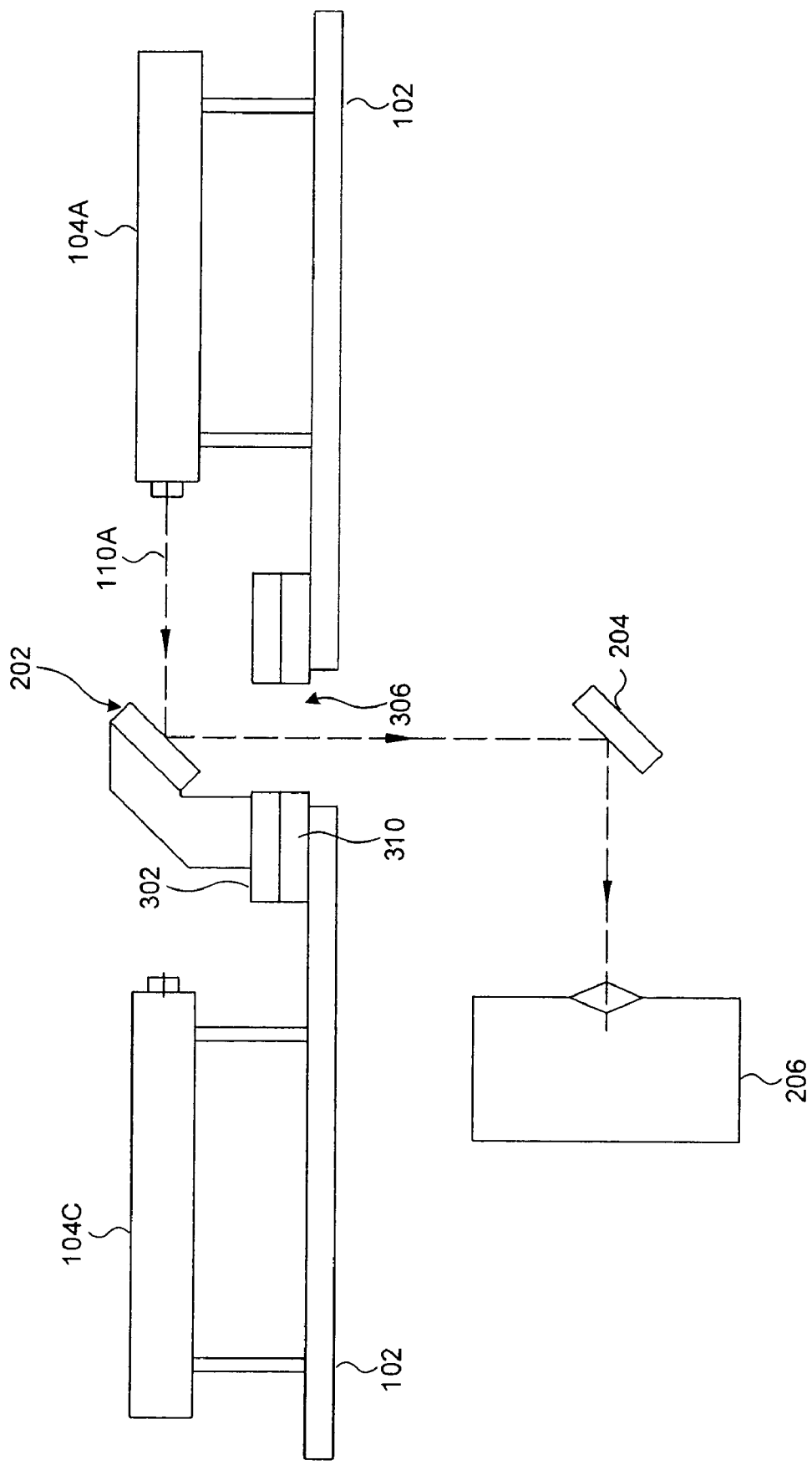

FIGS. 3 and 4 illustrate an alternative embodiment of the present invention that uses a rotary air bearing with a beam pass-through hole. As shown in FIGS. 3 and 4, an air bearing 302 is mounted on an air bearing support 310. A mirror 202 is mounted on the air bearing 302. Beams (e.g., beam 110A from the source 104A) are reflected off the mirror 202 downward, similar to the embodiment of the FIGS. 1 and 2. The beam passes through a hole 306 towards the mirror 204, and then to the projection optics 206.

One of the advantages of the embodiment of FIGS. 3 and 4 may be in simplifying the alignment issues of the mirror 202 relative to the sources 104.

Figure 5:
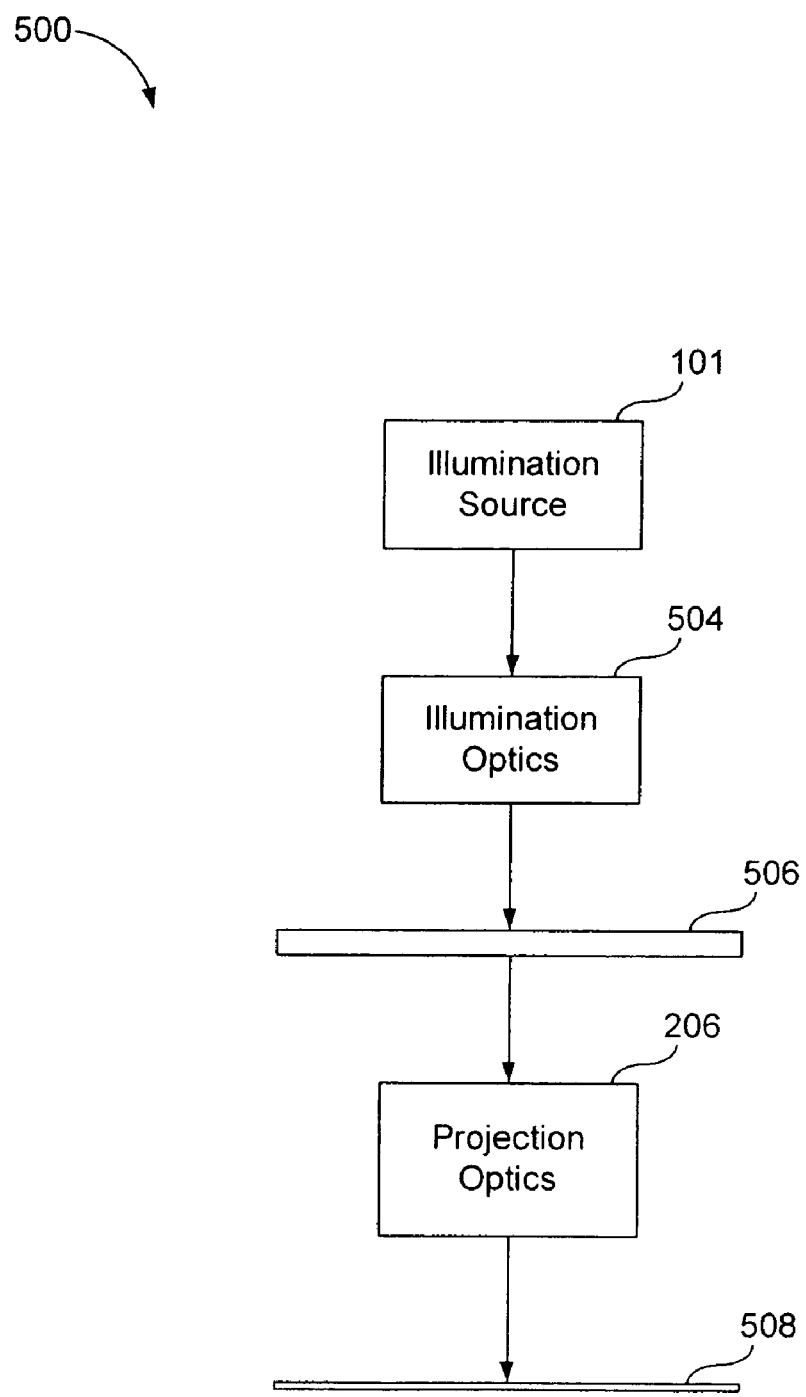
FIG. 5 shows a lithography system according to one embodiment of the present invention.

FIG. 5 shows a system 500 according to one embodiment of the present invention. System 500 includes an illumination source 101 that outputs light to illumination optics 504. Illumination optics 504 direct the light through (or off) a mask or reticle 506 onto a substrate 508 via projection optics 206. One application for this system can be a lithography system, or the like. Another application can be a holography system, or a laser welding system, or laser machining, or military applications, such as weapons, since the invention is not limited to lithographic applications, but may be used in other applications that require high power sources.

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A method of combining output of a plurality of light sources comprising:

arranging a plurality of light sources in a same plane and having their beams directed at a first mirror;

rotating the first mirror in the plane along an axis perpendicular to the plane while maintaining a same angle of orientation with each rotation with respect to each of the beams incident upon it in turn, so as to direct the beams towards a same direction; and pulsing the light sources in synchronization with the rotation of the first mirror, thereby directing the beam of each light source to expose a same area in turn, such that the beams combine at the exposed area.

2. The method of claim 1, further comprising directing the beams from the first mirror towards a second counter-rotating mirror, wherein rotation of the second counter-rotating mirror compensates for angular displacement of the beams due to rotation of the first mirror.

3. The method of claim 1, wherein the plurality of light sources comprise pulsed lasers.

4. The method of claim 1, wherein the plurality of light sources comprise lamps.

5. The method of claim 1, wherein the first mirror is mounted on an air bearing.

6. The method of claim 1, further comprising orienting the first mirror at about 45 degrees relative to an incident path of the beams.

7. The method of claim 1, further comprising exposing a substrate with the beams.

8. The method of claim 7, wherein the substrate is a flat panel display.

9. A method of exposing a substrate comprising:

arranging a plurality of light sources in a same plane and having their beams directed at a first mirror;

rotating the first mirror along an axis perpendicular to the plane while maintaining a same angle of orientation with each rotation with respect to each of the beams incident upon it in turn, so as to direct the beams towards a same direction;

pulsing the light sources in synchronization with the rotation of the first mirror; and exposing a same area of a substrate with the beams such that the beams combine at the exposed area.

* * * * *